US012446232B2

(12) United States Patent
Cheng et al.

(10) Patent No.: US 12,446,232 B2
(45) Date of Patent: Oct. 14, 2025

(54) MRAM-BASED CHIP IDENTIFICATION WITH FREE RANDOM PROGRAMMING

(71) Applicant: International Business Machines Corporation, Armonk, NY (US)

(72) Inventors: Kangguo Cheng, Schenectady, NY (US); Dimitri Houssameddine, Sunnyvale, CA (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 17/329,824

(22) Filed: May 25, 2021

(65) Prior Publication Data

US 2022/0384367 A1 Dec. 1, 2022

(51) Int. Cl.
 *H10B 61/00* (2023.01)
 *H01L 23/00* (2006.01)
 *H10N 50/80* (2023.01)

(52) U.S. Cl.
 CPC ........... *H10B 61/10* (2023.02); *H01L 23/573* (2013.01); *H10B 61/22* (2023.02); *H10N 50/80* (2023.02)

(58) Field of Classification Search
 CPC ....... H01L 23/573; H01L 43/08; H01L 43/02; H01L 27/228; H10B 61/22; H10B 61/10; H10N 50/80; H10N 50/10
 See application file for complete search history.

(56) References Cited

U.S. PATENT DOCUMENTS 7,288,834 B2    10/2007  De Jongh et al.
7,405,966 B2    7/2008   Seyyedy et al.
(Continued)

FOREIGN PATENT DOCUMENTS

CN     111370438 A  *  7/2020    ........... H01L 27/222
EP      3544014 B1      7/2020
(Continued)

OTHER PUBLICATIONS

Iba et al., Top-pinned Perpendicular MTJ Structure with a Counter Bias Magnetic Field Layer for Suppressing a Stray-Field in Highly Scalable STT-MRAM, 2013, Symposium on VLSI Technology Digest of Technical Papers9-4 (Year: 2013).*
(Continued)

*Primary Examiner* — Eduardo A Rodela
(74) *Attorney, Agent, or Firm* — Scully, Scott, Murphy & Presser, P.C.; Yuanmin Cai

(57) ABSTRACT

A magnetoresistive random access memory (MRAM) device having chip identification using normal operating voltages is provided. No dedicated programming is needed. Instead, programming of the MRAM device is free and random and is a result of providing a magnetic via structure sufficiently close to the magnetic free layer of the magnetic junction tunnel (MTJ) structure such that the magnetic via structure projects a magnetic field that interacts with the magnetic free layer and aligns the magnetization of the magnetic free layer with the magnetization of the magnetic via structure. Thus, the orientation of the magnetization of both the magnetic via structure and the magnetic free layer are aligned in a same direction. The magnetization of the magnetic via structure can thus be used as a physical unclonable function and the MTJ structure can be used to read out this information.

18 Claims, 8 Drawing Sheets

(56) References Cited

U.S. PATENT DOCUMENTS

| | | | |
|---|---|---|---|
| 9,070,465 | B2 | 6/2015 | Son et al. |
| 9,373,782 | B2 | 6/2016 | Li et al. |
| 9,496,486 | B2 | 11/2016 | Doyle et al. |
| 9,569,712 | B1 | 2/2017 | Annunziata et al. |
| 9,779,794 | B2 | 10/2017 | Doyle et al. |
| 9,865,806 | B2 | 1/2018 | Choi et al. |
| 10,298,407 | B2 | 5/2019 | Tanamoto et al. |
| 10,374,152 | B2 | 8/2019 | Annunziata et al. |
| 10,460,780 | B2 | 10/2019 | Kim et al. |
| 10,580,973 | B2 | 3/2020 | Doyle et al. |
| 10,763,425 | B1 | 9/2020 | Katti |
| 10,832,749 | B2 * | 11/2020 | Kuo ............... H10N 50/01 |
| 10,832,847 | B2 * | 11/2020 | Doyle ............. H10N 50/85 |
| 10,862,023 | B2 * | 12/2020 | Peng .............. H10N 50/85 |
| 11,917,923 | B2 * | 2/2024 | Wang ............. H10B 61/00 |
| 2015/0052302 | A1 | 2/2015 | Dong et al. |
| 2015/0069555 | A1 * | 3/2015 | Sakai ......... G11C 13/0033 257/421 |
| 2015/0071432 | A1 | 3/2015 | Zhu et al. |
| 2015/0249096 | A1 | 9/2015 | Lupino et al. |
| 2015/0280112 | A1 | 10/2015 | Li et al. |
| 2018/0122825 | A1 | 5/2018 | Lupino et al. |
| 2019/0043795 | A1 | 2/2019 | Chen et al. |
| 2019/0109281 | A1 | 4/2019 | Doyle et al. |
| 2020/0005861 | A1 | 1/2020 | O |
| 2020/0152699 | A1 | 5/2020 | Worledge et al. |
| 2020/0194662 | A1 * | 6/2020 | Chuang ........... H10N 50/80 |
| 2020/0313074 | A1 * | 10/2020 | Smith ............. H10N 50/80 |
| 2021/0020827 | A1 | 1/2021 | Shakh et al. |

FOREIGN PATENT DOCUMENTS

| | | | |
|---|---|---|---|
| JP | 2013-122802 | A | 12/2011 |
| JP | 2014-130946 | A | 7/2014 |
| JP | 2017-527101 | A | 9/2017 |
| JP | 2024-519573 | A | 5/2024 |
| KR | 10-2018-0022870 | A | 3/2018 |
| WO | 2022/247522 | A1 | 12/2022 |

OTHER PUBLICATIONS

Iba et al. NPL (Year: 2013).*

Zhang, L., et al., Highly Reliable Spin-Transfer Torque Magnetic RAM-Based Physical Unclonable Function With Multi-Response-Bits Per Cell, IEEE Transactions on Information Forensics and Security, Aug. 2015, pp. 1630-1642, vol. 10, Issue: 8.

Chien, W.-C., et al., "STT-DPSA: Digital PUF-Based Secure Authentication Using STT-MRAM for the Internet of Things", Micromachines 2020, Published: May 15, 2020, 28 pages, 11, 502.

Vatajelu, E. I., et al., "STT-MRAM-Based PUF Architecture Exploiting Magnetic Tunnel Junction Fabrication-Induced Variability" ACM Journal on Emerging Technologies in Computing Systems, Publication date: May 2016, 21 pages, vol. 13, No. 1, Article 5.

International Search Report dated Jul. 19, 2022, received in a corresponding foreign application, 8 pages.

Japan Patent Office, "Notice of Reasons for Refusal" Jul. 4, 2025, 10 Pages, JP Application No. 2023-562237.

* cited by examiner

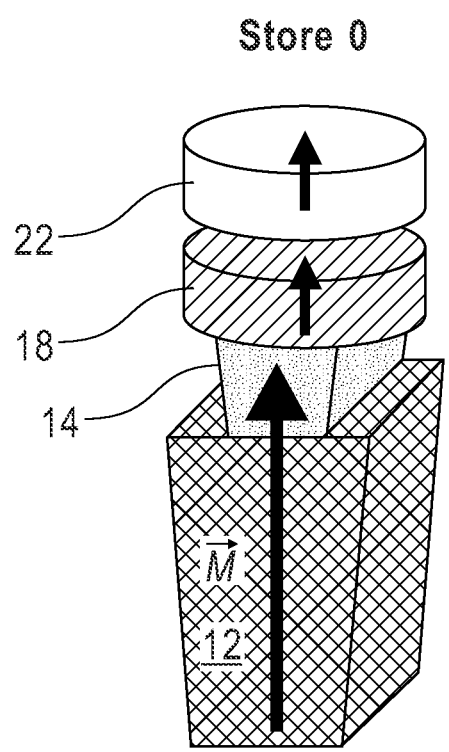
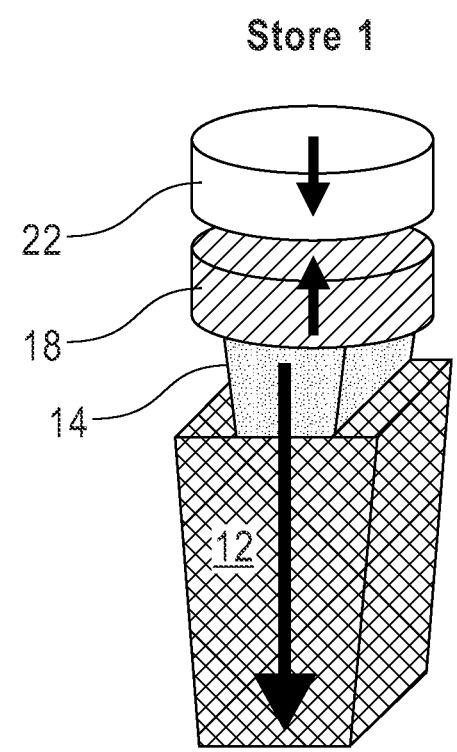
FIG. 5A
FIG. 5B

MRAM-BASED CHIP IDENTIFICATION WITH FREE RANDOM PROGRAMMING

BACKGROUND

The present application relates to non-volatile memory, and more particularly to a magnetoresistive random access memory (MRAM) device having chip identification that is obtained without the need of dedicated programming.

Chip identification is essential to prevent counterfeits, and sometimes chip identification can be used for device authentication. Conventional approaches of chip identification include using fuses, anti-fuses, or non-volatile memories (NVMs). After chip fabrication, a dedicated programming operation is needed to incorporate a unique identification to each chip. Programming after chip fabrication has several drawbacks. First, such a method of chip identification increases chip fabrication costs and programming can be problematic. Second, some chip identification approaches require high voltage operations. For example, high voltage is needed for programming electrical fuses and anti-fuses. A high voltage supply requires complicated circuits (e.g., charge pumping) that increases chip size and manufacturing cost. There is thus a need for improving chip identification.

SUMMARY

A magnetoresistive random access memory (MRAM) device having chip identification is provided. No dedicated programming is needed for the chip identification. Instead, programming of the MRAM device is free and random and is a result of providing a magnetic via structure in close proximity to a magnetic free layer of a magnetic tunnel junction (MTJ) structure. By "close proximity to" it is meant that the magnetic via structure is located sufficiently close to the magnetic free layer of the MTJ structure (i.e., a distance of no more than 30 nm separates the magnetic via structure from the magnetic free layer) such that the magnetic via structure projects a magnetic field that interacts with the magnetic free layer and aligns the magnetization of the magnetic free layer with the magnetization of the magnetic via structure. Thus, the magnetization vectors of the magnetic via structure and the magnetic free layer in the disclosed MRAM device are aligned in a same direction. The magnetization of the magnetic via structure can thus be used as a physical unclonable function (PUF) and the MTJ structure can be used to read out this information.

In one aspect of the present application, a MRAM device is provided. In one embodiment, the MRAM device includes a stack of a magnetic via structure and a first electrode located above a substrate. In some embodiments, the magnetic via structure is located beneath the first electrode, while in other embodiments, the magnetic via structure is located above the first electrode. The MRAM device further includes a first interconnect dielectric material layer embedding both the magnetic via structure and the first electrode, and a MTJ structure is located on the stack. The MTJ structure includes a tunnel barrier layer separating a magnetic free layer from a magnetic reference layer. The MRAM device further includes a second electrode located on the MTJ structure. In accordance with the present application, the magnetic via structure has a magnetic field that interacts with the magnetic free layer of the MTJ structure and aligns a magnetization of the magnetic free layer with a magnetization of the magnetic via structure. That is to say, the magnetization vectors of the magnetic via structure and the magnetic free layer are both orientated in a same direction.

In another aspect of the present application, a non-volatile memory (NVM) array is provided. In one embodiment, the NVM array includes a plurality of spaced apart MRAM devices located on a substrate, wherein each MRAM device of the plurality of MRAM devices comprises a stack of a magnetic via structure and a first electrode; a first interconnect dielectric material layer embedding both the magnetic via structure and the first electrode; a MTJ structure located on the stack, wherein the MTJ structure comprises a tunnel barrier layer separating a magnetic free layer from a magnetic reference layer; and a second electrode located on the MTJ structure, wherein the magnetic via structure has a magnetic field that interacts with the magnetic free layer of the MTJ structure and aligns a magnetization of the magnetic free layer with a magnetization of the magnetic via structure.

BRIEF DESCRIPTION OF THE DRAWINGS

FIG. 5A is a three-dimensional representation of a portion of the MRAM device shown in FIG. 2 wherein the MRAM device has zero (0) as an output.

FIG. 5B is a three-dimensional representation of a portion of the MRAM device shown in FIG. 2 wherein the MRAM device has one (1) as an output.

DETAILED DESCRIPTION

Figure 1A:
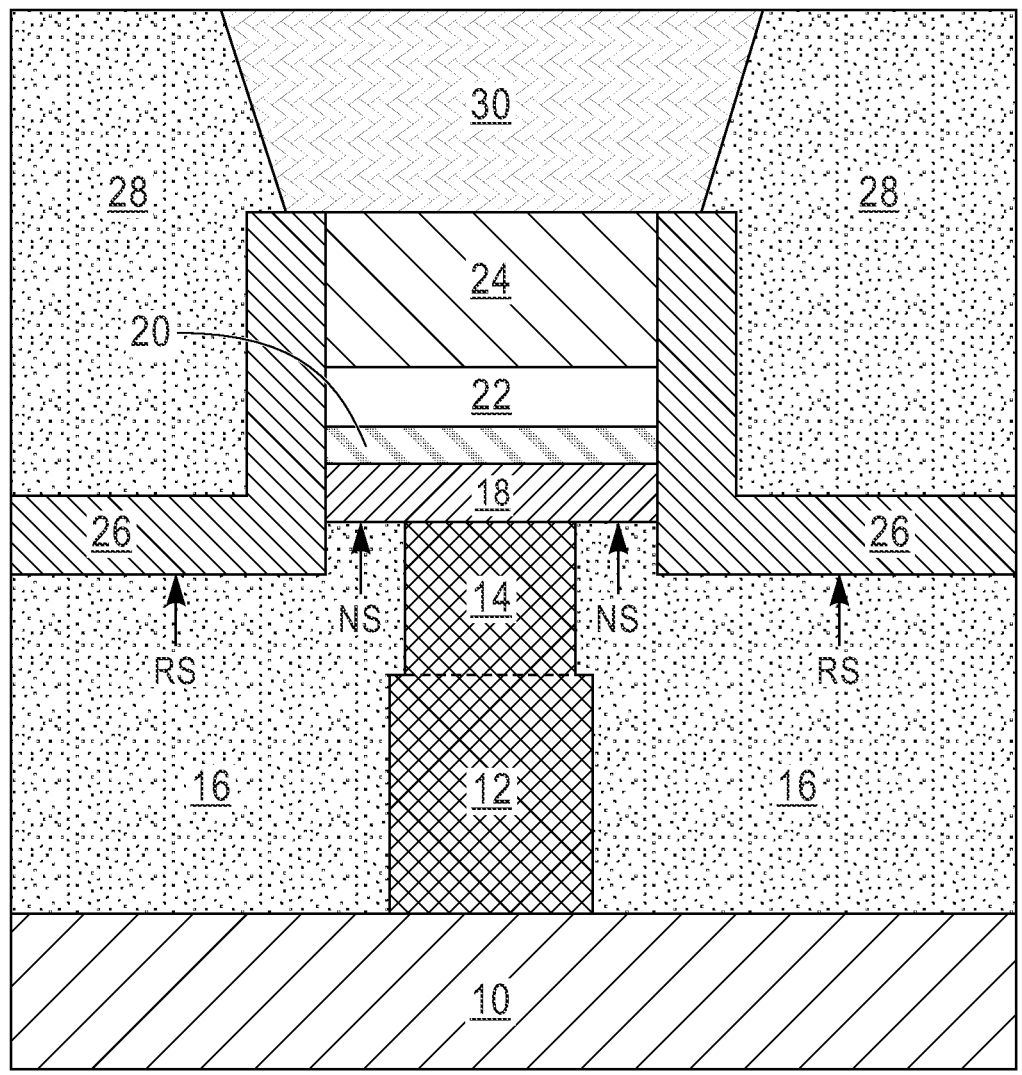
FIG. 1A is a cross-sectional view of a MRAM device including a magnetic via structure in close proximity to a magnetic free layer of a MTJ structure in accordance with an embodiment of the present application; in this drawing the magnetic field generated by the magnetic via structure is not shown.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terminology used herein is for the purpose of describing particular embodiments only and is not intended to be limiting of the present application. As used herein, the singular forms "a", "an" and "the" are intended to include the plural forms as well, unless the context clearly indicates otherwise. It will be further understood that the terms "comprises" and/or "comprising", when used in this application, specify the presence of stated features, integers, steps, operations, elements, and/or components, but do not preclude the presence or addition of one or more other features, integers, steps, operations, elements, components, and/or groups thereof.

As stated above, a MRAM device having chip identification is provided. No dedicated programming is needed for the chip identification. Instead, programming of the MRAM device is free and random and is a result of providing a magnetic via structure sufficiently close to (i.e., in close proximity to) the magnetic free layer of the MTJ structure such that the magnetic via structure projects a magnetic field that interacts with the magnetic free layer and aligns the magnetization of the magnetic free layer with the magnetization of the magnetic via structure. In the present application, a distance (as measured from a topmost surface of the magnetic via structure to a bottommost surface of the magnetic free layer) of no more than 30 nm separates the magnetic via structure from the magnetic free layer. Due to the presence of the magnetic via structure in close proximity to the magnetic free layer, the orientation of the magnetization of both the magnetic via structure and the magnetic free layer are aligned in a same direction. The magnetization of the magnetic via structure can thus be used as a physical unclonable function and the MTJ structure can be used to read out this information. These and other aspects of the present application will now be described in greater detail.

Referring first to FIG. 1A, there is illustrated a MRAM device including a magnetic via structure 12 in close proximity to a magnetic free layer 22 of a MTJ structure (18/20/22) in accordance with an embodiment of the present application. As previously defined, the term "close proximity to" denotes that that the magnetic via structure 12 is located sufficiently close to the magnetic free layer 22 of the MTJ structure (18/20/22) (i.e., a distance of no more than 30 nm separates the magnetic via structure 12 from the magnetic free layer 22) such that the magnetic via structure 12 projects a magnetic field (See, FIG. 1B as well as FIGS. 2 and 3) that interacts with the magnetic free layer 22 and aligns the magnetization of the magnetic free layer 22 with the magnetization of the magnetic via structure 12. Thus, the magnetization vectors of the magnetic via structure 12 and the magnetic free layer 22 in the MRAM device of the present application are orientated in a same direction.

Figure 1B:
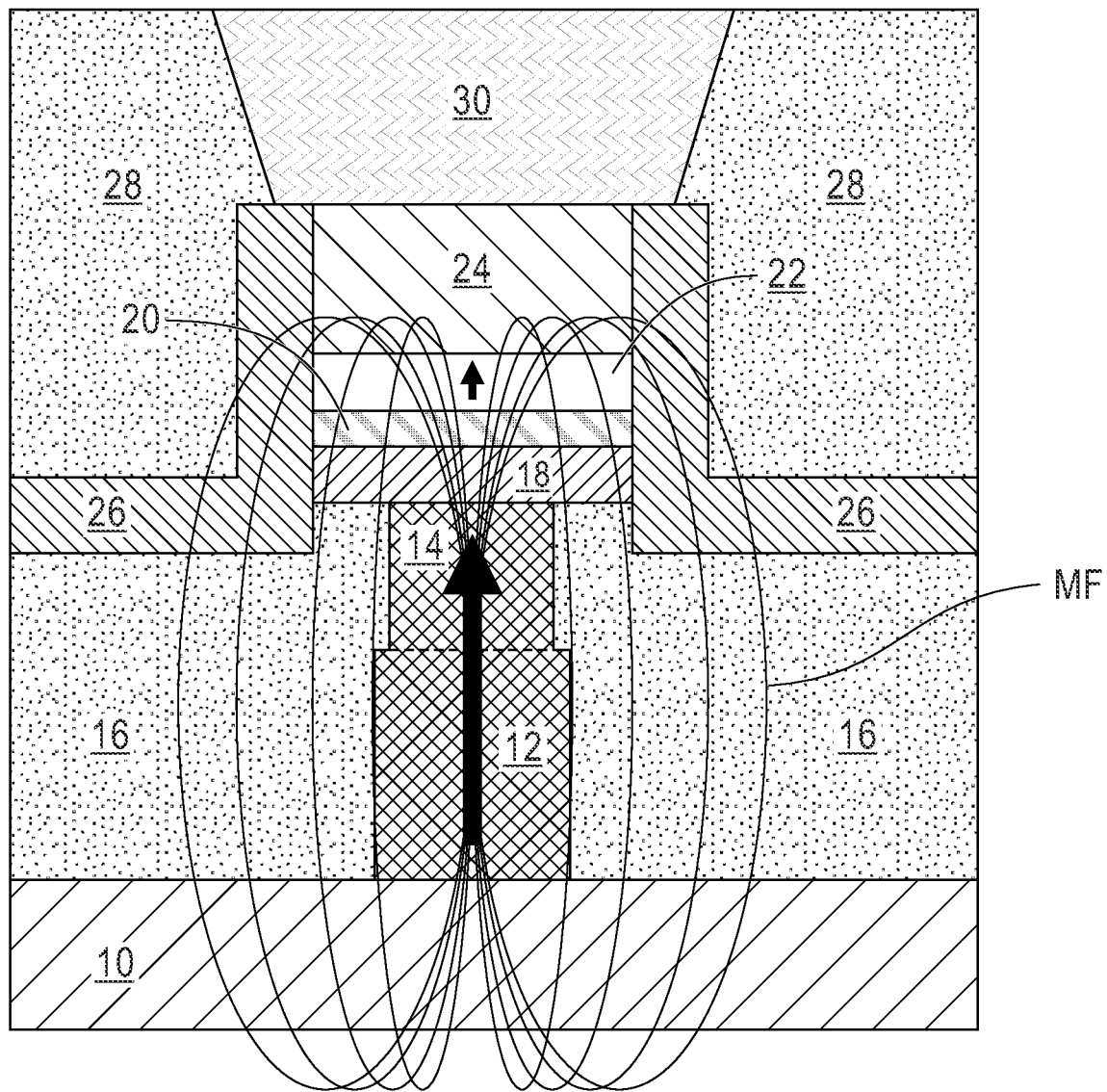
FIG. 1B is a cross-sectional view of the same MRAM device shown in FIG. 1A showing the magnetic field generated by the magnetic via structure in accordance with an embodiment of the present application.
Figure 2:
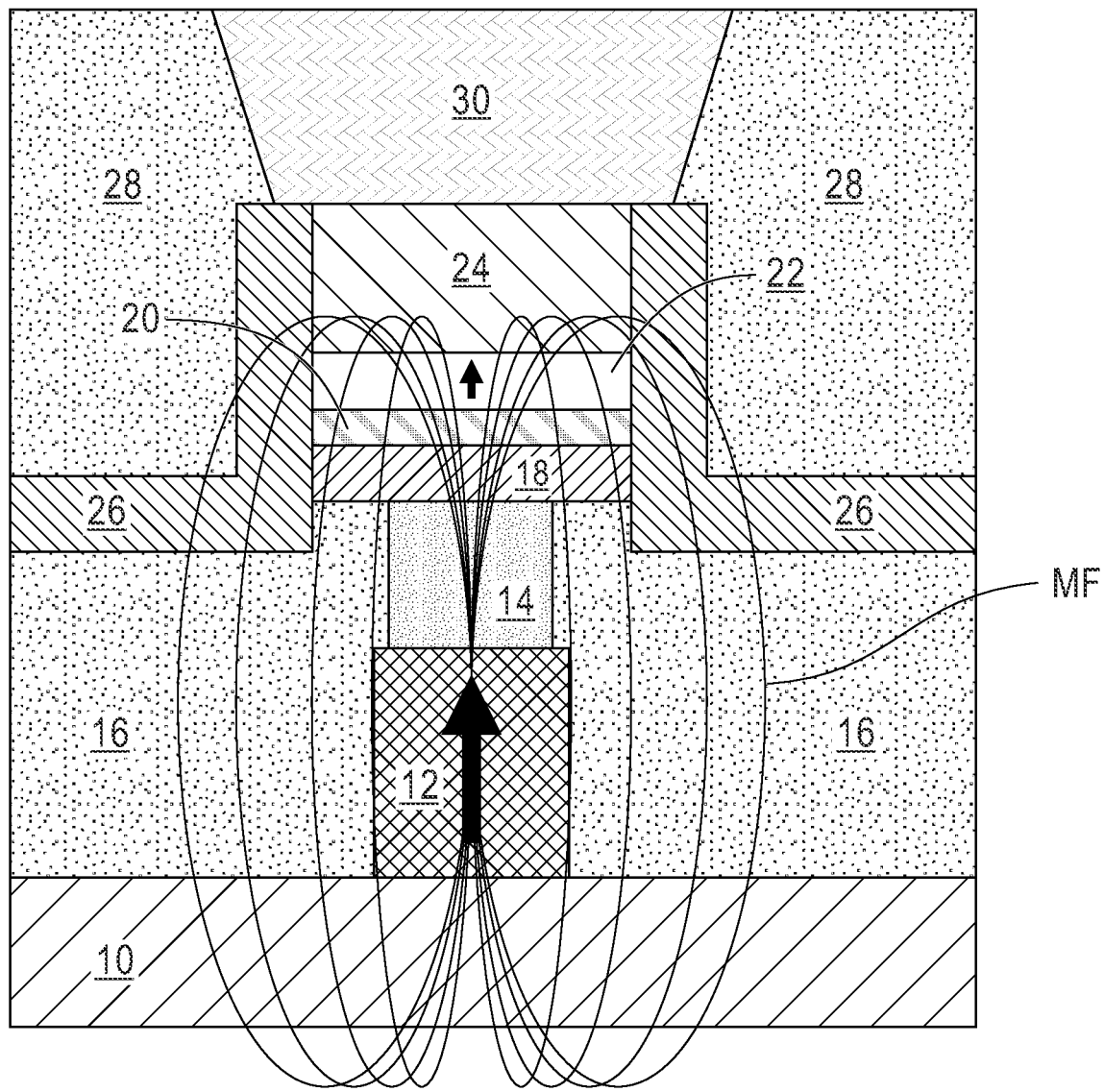
FIG. 2 is a cross-sectional view of a MRAM device including a magnetic via structure in close proximity to a magnetic free layer of a MTJ structure in accordance with another embodiment of the present application; in this drawing the magnetic field generated by the magnetic via structure is shown.
Figure 3:
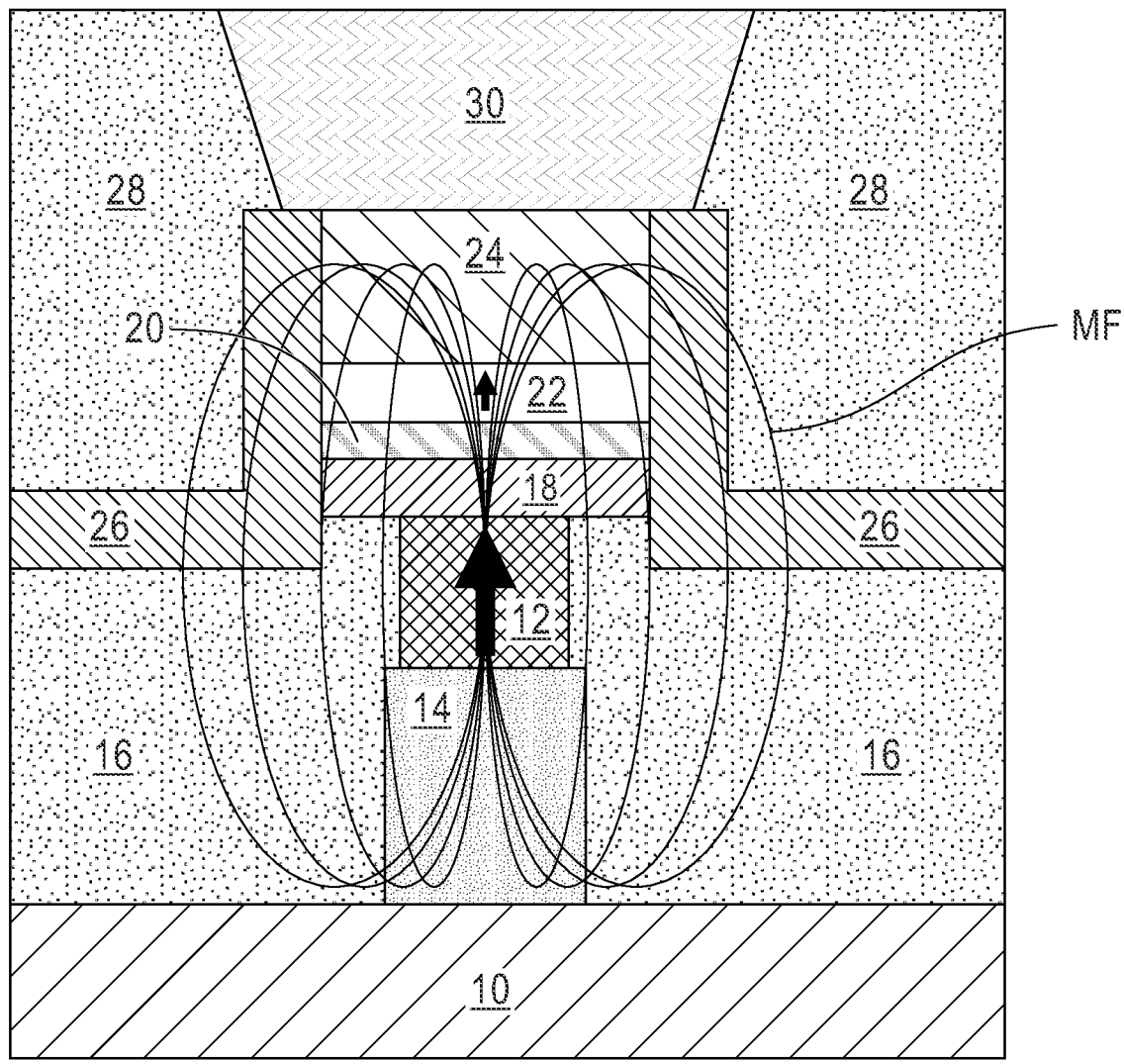
FIG. 3 is a cross-sectional view of a MRAM device including a magnetic via structure in close proximity to a magnetic free layer of a MTJ structure in accordance with a further embodiment of the present application; in this drawing the magnetic field generated by the magnetic via structure is shown.

In FIG. 1A, the magnetic field generated by the magnetic via structure 12 is not shown, however, FIG. 1B shows the magnetic field, MF, that is generated by the magnetic via structure 12 in the MRAM device of FIG. 1A; FIGS. 2-3 also show the magnetic field, MF, for alternative MRAM devices of the present application. It is noted that FIGS. 1A-1B (as well as FIGS. 2-3) illustrate a memory device area of a back-end-of-the-line (BEOL) structure in which the MRAM device of the present application is present. Non-memory device areas of the BEOL structure can be located adjacent to, and to the periphery of, the memory device area shown in FIGS. 1A, 1B, 2 and 3. The non-memory device areas can include other BEOL devices/structures including, for example, BEOL resistors and/or interconnect structures.

Notably, the illustrated MRAM device of FIGS. 1A-1B includes a magnetic via structure 12 located on a substrate 10, a first electrode 14 is located on the magnetic via structure 12, a first interconnect dielectric material layer 16 embeds both the magnetic via structure 12 and the first electrode 14, and a MTJ structure (18/20/22) is located on the first electrode 14. The MTJ structure (18/20/22) includes a tunnel barrier layer 20 separating a magnetic free layer 22 from a magnetic reference layer 18. The MRAM device of FIGS. 1A-1B further includes a second electrode 24 located on the MTJ structure (18/20/22). In the present application, the first electrode 12 can be referred to as a bottom electrode, while the second electrode 24 can be referred to as a top electrode 24.

The MRAM device of FIGS. 1A-1B can further include a contact structure 30 located on, and contacting a surface of, the second electrode 24. As is shown in FIGS. 1A-1B, the contact structure 30 and the MTJ structure (18/20/22) are both embedded in a second interconnect dielectric material layer 28. In some embodiments, and as is illustrated in FIGS. 1A-1B, a dielectric material liner 26 can be present entirely along a sidewall of both the second electrode 24 and the MTJ structure (18/20/22) and is present on a surface of the first interconnect dielectric material layer 16. In some embodiments, the dielectric material liner 26 is present entirely along a sidewall of the MTJ structure (18/20/22) and partially along a lower portion of a sidewall of the second electrode 24. In such an embodiment, a portion of the contact structure 30 can contact the upper portion of the sidewall of the second electrode 24. In some embodiments, the dielectric material liner 26 can be omitted.

The MRAM device shown in FIGS. 1A-1B (as well as FIGS. 2-3) can be fabricated using techniques well known in the art including various deposition processes, lithographic patterning, etching and planarization. So as not to obscure the gist of the present application, details concerning the processing techniques used in fabricating the MRAM device are not provided herein. Each of the components of the MRAM device shown in the FIGS. 1A and 1B will now be described in greater detail.

Substrate 10, which is located beneath the first interconnect dielectric material layer 16 and the stack of the magnetic via structure 12 and the first electrode 14, can be a front-end-of-the-line (FEOL) level, a metal level, or any combination thereof, with the proviso that the FEOL represents the lowest level of the substrate 10. The FEOL level can include one or more complementary metal oxide semiconductor (CMOS) devices located on, or within, a semiconductor substrate. For example, field effect transistors (FETs) can be located on the semiconductor substrate. The metal level can be a middle-of-the-line (MOL) level and/or one or more lower interconnect levels. The metal level can include one or more electrically conductive structures (such as, for example, copper (Cu) structures, aluminum (Al) structures, and/or tungsten (W) structures) embedded within one or more dielectric material layers. The one or more dielectric materials layers of the metal level can be composed of any suitable dielectric material, such as, for example, low-k dielectrics (i.e., dielectric materials having a smaller dielectric constant relative to silicon dioxide, i.e., less than about 3.9) and/or ultra low-k dielectric materials (i.e., dielectric materials having a dielectric constant of less than 3.0). The dielectric constants mentioned herein are measured in a vacuum unless otherwise stated. In some embodiments, the one or more dielectric material layers of the metal level can include silicon dioxide. In one embodiment of the present application, substrate 10 includes, from bottom to top, a FEOL level, a MOL level, and one or more interconnect levels.

The magnetic via structure 12, which is located above the substrate 10 and is embedded in the first interconnect dielectric material layer 16, is composed of a magnetic material. Illustrative examples of magnetic materials that can provide the magnetic via structure 12 include, but are not limited to, cobalt (Co), tungsten (W), nickel (Ni) or alloys thereof. One example of a magnetic alloy that can be used as the magnetic material of the magnetic via structure 12 is an alloy of Co—Ni.

The magnetic via structure 12 of the present application has a high aspect ratio (i.e., a ratio of height to diameter) of greater than 2:1. In some embodiments of the present application, the magnetic via structure 12 has an aspect ratio of from 5:1 to 100:1. The magnetic via structure 12 of the present application is typically cylindrical in shape; although other asymmetric shapes are possible and can be used in the present application as the shape of the magnetic via structure 12.

In accordance with the present application, the magnetic via structure 12 generates a magnetic field, MF, as is shown, for example, in FIG. 1B that interacts with the magnetic free layer 22 and is strong enough (greater than several hundreds of Oersted) to align the magnetization of the magnetic free layer 22 with the magnetization of the magnetic via structure 12. Thus, the magnetization vectors of magnetic via structure 12 and the magnetic free layer 22 in the MRAM device of the present application are orientated in a same direction.

Applicant observes that after processing the MRAM device of the present application, the magnetic via structure 12 has a magnetization (i.e., magnetic vector) that points in a single direction. In some embodiments of the present application, the magnetization of the magnetic via structure 12 is pointed upward. In other embodiments of the present application, the magnetization of the magnetic via structure 12 is pointed downward. Applicant notes that immediately after the formation of the magnetic via structure 12, the magnetization of the magnetic via structure 12 might not be pointed up or down. However, during the processing of the MRAM device of the present application, the magnetization of the magnetic via structure 12 will typically relax towards its minimum energy states—either up or down, and the magnetization of the magnetic free layer 22 will follow and will point in the same direction as the magnetization of the magnetic via structure 12. Applicant further notes that the magnetization of the magnetic via structure 12 is random and is dependent on the aspect ratio of the magnetic via structure 12. Thus, the magnetic via structure 12 of the present application can be used as a PUF, and the MTJ structure (18/20/22) can read out this information.

In the illustrated embodiment shown in FIGS. 1A-1B, the magnetic via structure 12 has a first surface that forms a first interface with a surface of substate 10, and a second surface, opposite the first surface, the forms a second interface with a surface of the first electrode 14. In the illustrated embodiment shown in FIGS. 1A-1B, the magnetic via structure 12 is located beneath the first electrode 14.

In the embodiment shown in FIGS. 1A-1B, the first electrode 14 is composed of a magnetic material which can further add to the magnetic field strength of the magnetic via structure 12. Illustrative examples of magnetic materials that can provide the first electrode 14 include cobalt (Co), nickel (Ni), tungsten (W), iron (Fe), magnetic rare earth metals, including but not limited to gadolinium (Gd), neodymium (Nd), or alloys thereof. The magnetic material that provides the first electrode 14 can be compositionally the same as, or compositionally different from, the magnetic material that provides the magnetic via structure 12. In one embodiment, the first electrode 14 and the magnetic via structure 12 are both composed of Co. In another embodiment, the first electrode 14 is composed of W, and the magnetic via structure 12 is composed of Co. In FIGS. 1A-1B, a dotted line is shown as a possible location of a material interface that can exist between the first electrode 14 and the magnetic via structure 12.

The first electrode 14 typically is cylindrical in shape; although other asymmetric shapes are possible and can be used in the present application as the shape of the first electrode 14. Typically, but not necessarily always, the shape of the first electrode 14 matches the shape of the magnetic via structure 12. The first electrode 14 can have a critical dimension (CD) (i.e., diameter) that is smaller than, equal to, or less than, the CD, i.e., diameter, of the magnetic via structure 12. FIGS. 1A-1B illustrates an embodiment in which the CD of the first electrode 14 is less than the CD of the magnetic via structure 12. The first electrode 14 can have an aspect ratio that is from 1:1 to 1:5.

In the illustrated embodiment of FIGS. 1A-1B, the first electrode 14 has a first surface that forms a first interface with a surface of the magnetic via structure 12 and a second surface, that is opposite the first surface, that forms a second interface with a surface of the MTJ structure (18/20/22). In the illustrated embodiment shown in FIGS. 1A-1B, the second surface of the first electrode 14 that forms the second interface with the MTJ structure (18/20/22) is coplanar with a non-recessed surface, NS, of the first interconnect dielectric material layer 16.

The first interconnect dielectric material layer 16, which laterally surrounds the stack containing the magnetic via structure 12 and the first electrode 14, can include one or more interconnect dielectric materials. When more than one interconnect dielectric material is used in providing the first interconnect dielectric material layer 16, each dielectric material that provides the first interconnect dielectric material layer 16 is stacked one atop the other. In some embodiments when more than one interconnect dielectric material is used in providing the first interconnect dielectric material layer 16, each dielectric material that provides the first interconnect dielectric material layer 16 can be composed of a compositionally same interconnect dielectric material. In other embodiments when more than one interconnect dielectric material is used in providing the first interconnect dielectric material layer 16, compositionally different interconnect dielectric materials can be used in providing the first interconnect dielectric material. In such an embodiment, the magnetic via structure 12 can be embedded in a lower portion of the first interconnect dielectric material layer 16 that is composed of a first interconnect dielectric material, while the first electrode 14 can be embedded in an upper portion of the first interconnect dielectric material layer 16 that is composed of a second interconnect dielectric material, which differs compositionally from the first interconnect dielectric material. In such an embodiment, a material interface (not shown) would be present between the first and second dielectric materials used in providing the first interconnect dielectric material layer 16.

Illustrative examples of interconnect dielectric materials that can be used as the first interconnect dielectric material layer 16 include, but are not limited to, silicon dioxide, low-k dielectric materials as defined above, and/or ultra low-k dielectric materials as defined above. The first interconnect dielectric material layer 16 can be porous, non-porous, or contain at least one porous region and at least one non-porous region.

In some embodiments of the present application, and as is illustrated in FIGS. 1A and 1B, the first interconnect dielectric material layer 16 has a recessed surface, RS, that is located adjacent to a non-recessed surface, NS. In such an embodiment, the non-recessed surface, NS, (i.e., topmost surface) of the first interconnect dielectric material layer 16 can be coplanar with a topmost surface of the first electrode 14. The recessed surface, RS, can be formed during the patterning process used in forming the MTJ structure (18/20/22) and the second electrode 24. In some embodiments, no recessed surface, RS, is present in the first interconnect dielectric material layer 16. In such an embodiment, the first interconnect dielectric material layer 16 has a topmost surface that is entirely non-recessed.

The MTJ structure (18/20/22) that can be used in the present application includes at least a tunnel barrier layer 20 that separates a magnetic reference layer 18 from a magnetic free layer 22. The MTJ structure (18/20/22) of the present application is engineered to have a low coercive field so that the magnetization of the magnetic free layer 22 will naturally align with the magnetization of the magnetic via structure 12. In one example, the "low coercive field" is less than, or equal to, 500 Oe.

In the present application, the location of the magnetic free layer 22 of the MTJ structure (18/20/22) relative to the magnetic reference layer 18 of the same MTJ structure (18/20/22) may vary. For example, and in some embodiments as is illustrated in the various drawings of the present application, the MTJ structure (18/20/22) is a bottom pinned MTJ structure including, from bottom to top, the magnetic reference layer 18, the tunnel barrier layer 20, and the magnetic free layer 22. In such an embodiment and for the embodiment depicted in FIGS. 1A-1B, the magnetic reference layer 18 can form an interface with the underlying first electrode 14.

In other embodiments of the present application (which can be readily ascertained from the various drawings of the present application by flipping the MTJ structure (18/20/22) 180 degrees), the MTJ structure (18/20/22) is a top pinned MTJ structure including, from bottom to top, the magnetic free layer 22, the tunnel barrier layer 20, and the magnetic reference layer 18. In such an embodiment (and when the first electrode 14 is located above the magnetic via structure 12), the magnetic free layer 22 can form an interface with the underlying first electrode 14.

The magnetic reference layer 18 that can be used in the present application as an element of the MTJ structure (18/20/22) has a fixed magnetization; i.e., the magnetization of the magnetic reference layer 18 points in one direction, for example, up or down, regardless of the magnetization of the other neighboring magnetic layers. The magnetic reference layer 18 can be referred to as a magnetic pinned layer. The magnetic reference layer 18 can be composed of a metal or metal alloy that includes one or more metals exhibiting high spin polarization. Exemplary metals for the magnetic reference layer 18 include iron (Fe), nickel (Ni), cobalt (Co), chromium (Cr), boron (B), and manganese (Mn). Exemplary metal alloys for the magnetic reference layer 18 may include two or more of the metals exemplified by the above. In another embodiment, the magnetic reference layer 18 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt (Co), nickel (Ni), platinum (Pt), palladium (Pd), iridium (Jr), or ruthenium (Ru), and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 20 that can be used in the present application as an element of the MTJ structure (18/20/22) is composed of an insulator material and is formed at such a thickness as to provide an appropriate tunneling resistance. Exemplary materials for the tunnel barrier layer 20 include magnesium oxide, aluminum oxide, and titanium oxide, or materials of higher electrical tunnel conductance, such as semiconductors or low-bandgap insulators.

The magnetic free layer 22 that can be used in the present application as an element of the MTJ structure (18/20/22) is composed of at least one magnetic material with a magnetization that can be changed in orientation. Exemplary materials for the magnetic free layer 22 of the MTJ structure (18/20/22) include alloys and/or multilayers of cobalt, iron, alloys of cobalt-iron, nickel, alloys of nickel-iron, and alloys of cobalt-iron-boron. In accordance with the present application, the orientation of the magnetization of the magnetic free layer 22 is influenced by the magnetic field that is generated by the magnetic via structure 12 such that the magnetization of the magnetic free layer 22 is aligned with the magnetization of the magnetic via structure 12.

In some embodiments, a non-magnetic metallic spacer layer can be present in the magnetic free layer 22; in such an embodiment the non-magnetic metallic spacer layer would divide the magnetic free layer 22 into a first magnetic free layer portion and a second magnetic free layer portion. When present, the non-magnetic metallic spacer layer is composed of a non-magnetic metal or metal alloy that allows magnetic information to be transferred therethrough and also permits the two magnetic free layer portions to couple together magnetically, so that in equilibrium the first and second magnetic free layer portions are always parallel. The non-magnetic metallic spacer layer allows for spin torque switching between the first and second magnetic free layer portions of a particular magnetic free layer 22.

In some embodiments (not shown) in which the magnetic free layer 22 is located at the bottom of the MTJ structure, a metal seed layer can be located between the first electrode 14 and the magnetic free layer 22. This optional metal seed layer can be composed of platinum (Pt), palladium (Pd), nickel (Ni), iridium (Jr), rhenium (Re) or alloys and multilayers thereof.

In some embodiments (not shown), a MTJ cap layer is present as a topmost layer of the MTJ structure (18/20/22) and the MTJ cap layer forms an interface with the second electrode 24. When present, the MTJ cap layer can be composed of niobium (Nb), niobium nitride (NbN), tungsten (W), tungsten nitride (WN), tantalum (Ta), tantalum nitride (TaN), titanium (Ti), titanium nitride (TiW), ruthenium (Ru), molybdenum (Mo), chromium (Cr), vanadium (V), palladium (Pd), rhodium (Ru), scandium (Sc), aluminum (Al) or other high melting point conductive metals or conductive metal nitrides.

The MTJ structure (18/20/22) typically is cylindrical in shape; although other asymmetric shapes are possible and can be used in the present application as the shape of the MTJ structure (18/20/22). The CD of the MTJ structure (18/20/22) can be the less than, equal to, or greater than, the CD of the underlying first electrode 14. Critical dimensions of the MTJ structure (18/20/22) that are greater than the CD of the underlying first electrode 14 are preferred since no metallic residue of the underlying first electrode 14 can be deposited on the sidewall of the MTJ structure (18/20/22) during the formation of MTJ structure (18/20/22) which usually includes deposition of the various layers of the MTJ structure (18/20/22) and patterning of the deposited layers using an ion beam etching process. The presence of metallic residue on the sidewall of the MTJ structure (18/20/22) can cause shorting of the MRAM device.

The second electrode 24 which is located on top of the MTJ structure (18/20/22) can be composed of a conductive material such as, for example, tantalum (Ta), tantalum nitride (TaN), titanium (Ti), titanium nitride (TiN), ruthenium (Ru), ruthenium nitride (RuN), ruthenium-tantalum (RuTa), ruthenium-tantalum nitride (RuTaN), cobalt (Co), cobalt-tungsten-phosphorus (CoWP) alloy, cobalt nitride (CoN), tungsten (W), tungsten nitride (WN) or any multilayer combination thereof. In one multilayer combination example, the second electrode 24 is composed of Ti/TiN.

The second electrode 24 typically is cylindrical in shape; although other asymmetric shapes are possible and can be used in the present application as the shape of the second electrode 24. The shape of the second electrode 24 is typically the same as the shape of the MTJ structure (18/20/22). In one example, both the MTJ structure (18/20/22) and the second electrode 24 are cylindrical in shape. The CD of the second electrode 24 is typically the same as the CD of the underlying MTJ structure (18/20/22).

The dielectric material liner 26, which can also be referred to as an encapsulation liner, is composed of a dielectric material that can provide passivation to the MTJ structure (18/20/22) and the second electrode 24. In one embodiment, the dielectric material liner 26 is composed of silicon nitride. In another embodiment, the dielectric material liner 26 can be composed of a dielectric material that contains atoms of silicon, carbon, and hydrogen. In some embodiments, and in addition to atoms of carbon and hydrogen, the dielectric material that provides the dielectric material liner 26 can include atoms of at least one of nitrogen and oxygen. In other embodiments, and in addition to atoms of silicon, nitrogen, carbon and hydrogen, the dielectric material that provides the dielectric material liner 26 can include atoms of boron. In one example, the dielectric material liner 26 can be composed of an nBLOK dielectric material that contains atoms of silicon, carbon, hydrogen, nitrogen, and oxygen. In alternative example, the dielectric material liner 26 can be composed of a SiBCN dielectric material that contains atoms of silicon, boron, carbon, hydrogen, and nitrogen. The dielectric material liner 26 typically has a topmost surface that is coplanar with a topmost surface of the top electrode 24.

The second interconnect dielectric material layer 28 can include one of the interconnect dielectric materials mentioned above for the first interconnect dielectric material layer 16. The interconnect dielectric material that provides the second interconnect dielectric material layer 28 can be compositionally the same as, or compositionally different from, the interconnect dielectric material that provides the first interconnect dielectric material layer 16.

The contact structure 30, which is embedded in the second interconnect dielectric material layer 28, comprises an electrically conductive metal or an electrically conductive metal alloy. Examples of electrically conductive materials that can be used in providing the contact structure 30 include, but are not limited to, copper (Cu), aluminum (Al), tungsten (W) or a Cu—Al alloy. The contact structure 30 may also include a diffusion barrier liner located along a sidewall and a bottom wall of the electrically conductive material. When present, the diffusion barrier is composed of a diffusion barrier material such as, for example, tantalum (Ta), tantalum nitride (TaN), titanium (Ti), titanium nitride (TiN), ruthenium (Ru), ruthenium nitride (RuN), RuTa alloy, RuTaN alloy, tungsten (W), tungsten nitride (WN) or multilayer combinations thereof. As is shown, the contact structure 30 has a topmost surface that is coplanar with a topmost surface of the second interconnect dielectric material layer 28.

Referring now to FIG. 2, there is illustrated a MRAM device including a magnetic via structure 12 in close proximity to a magnetic free layer 22 of MTJ structure (18/20/22) in accordance with another embodiment of the present application; in this drawing the magnetic field, MF, generated by the magnetic via structure 12 is shown. The MRAM device shown in FIG. 2 is similar to the MRAM device shown in FIGS. 1A-1B except that the first electrode 14 of this embodiment of the present application is composed of a non-magnetic conductive material, not a magnetic material as was the case shown in FIGS. 1A-1B. All other components/elements of the MRAM device of FIG. 2 are the same as those described above for the MRAM device shown in FIGS. 1A-1B. Although FIGS. 2 and 3 illustrate a bottom pinned MTJ structure, the embodiments shown in FIGS. 2 and 3 work equally well with a top pinned MTJ structure.

In this embodiment, the non-magnetic conductive material that provides the first electrode 14 can include, but is not limited to, tantalum (Ta), tantalum nitride (TaN), titanium (Ti), titanium nitride (TiN), ruthenium (Ru), ruthenium nitride (RuN), ruthenium-tantalum (RuTa), ruthenium-tantalum nitride (RuTaN), or any multilayer combination thereof. In one multilayer combination example, the first electrode 14 can be composed of Ti/TiN.

Referring now to FIG. 3, there is illustrated a MRAM device including a magnetic via structure 12 in close proximity to a magnetic free layer 22 of MTJ structure (18/20/22) in accordance with a further embodiment of the present application; in this drawing the magnetic field, MF, generated by the magnetic via structure is shown. The MRAM device shown in FIG. 3 is similar to the MRAM device shown in FIGS. 1A-1B except that the first electrode 14 of this embodiment of the present application is located beneath the magnetic via structure 12. All other components/elements of the MRAM device of FIG. 3 are the same as those described above for the MRAM device shown in FIGS. 1A-1B.

In the illustrated embodiment shown in FIG. 3, the first electrode 14 has a first surface that forms an interface with a surface of the substrate 10, and a second surface, opposite the first surface, that forms an interface with a first surface of the magnetic via structure 12. In this embodiment, the second surface of the magnetic via structure 12, which is opposite the first surface of the magnetic via structure 12, forms an interface with the MTJ structure (18/20/22). In this embodiment, the second surface of the magnetic via structure 12 that forms an interface with the MTJ structure (18/20/22) is coplanar with a non-recessed surface, NS, of the first interconnect dielectric material layer 26.

In this embodiment of the present application, the magnetic via structure 12 can have a CD that is the same as, or less than the CD the underlying first electrode 14. In this embodiment, the magnetic via structure 12 still has a high aspect ratio.

In this embodiment, the first electrode 14 is typically composed of a non-magnetic conductive material as mentioned above for the first electrode 14 shown in the embodiment of FIG. 2. In some instances, the first electrode 14 can be composed of a magnetic material as mentioned above for the first electrode 14 shown in FIGS. 1A-1B.

The MRAM devices (such as shown in FIGS. 1A, 1B, 2 and 3) of the present application have chip identification using normal operating voltages and without the need of using a dedicated programming. The spatial distribution of the fringing magnetic field, MF, generated by the magnetic via structure 12 extends into the magnetic free layer 22 of the MTJ structure (18/20/22). The fringing magnetic field generated by the magnetic via structure 12 interacts with the magnetization of the magnetic free layer 22 and influences its' orientation. Notably, the magnetization vectors of both the magnetic via structure 12 and the magnetic free layer 22 are aligned in a same direction randomly pointing up or down. The magnetization of the magnetic reference layer 18 is fixed and always points in the same direction. In FIGS. 1B, 2, 3, 4A, 4B, 5A, 5B, 6A and 6B the singled headed arrows designate the direction of the magnetization of various layers/components of the MRAM device. The programming of the MRAM device of the present application is random and is free as it occurs as a by-product of the magnetic via structure 12. The magnetization of the magnetic via structure 12 can be used as a physical unclonable function and the MTJ structure (18/20/22) can be used to read out this information.

In the present application, when each of the magnetic via structure 12, the magnetic reference layer 18, and the magnetic free layer 22 have a magnetization that is orientated in a same direction, the MTJ structure (18/20/22) can read out a zero (0). When the magnetic via structure 12 and the magnetic free layer 22 have a magnetization that is orientated in a same first direction, and the magnetic reference layer 18 has a magnetization that orientated in a second direction that is opposite the first direction, the MTJ structure (18/20/22) can read out a one (1). This aspect of the present application is illustrated in FIGS. 4A, 4B, 5A, 5B, 6A and 6C. The "0" and "1" are logic read outs that can be used as a means of chip identification.

Figure 4A:
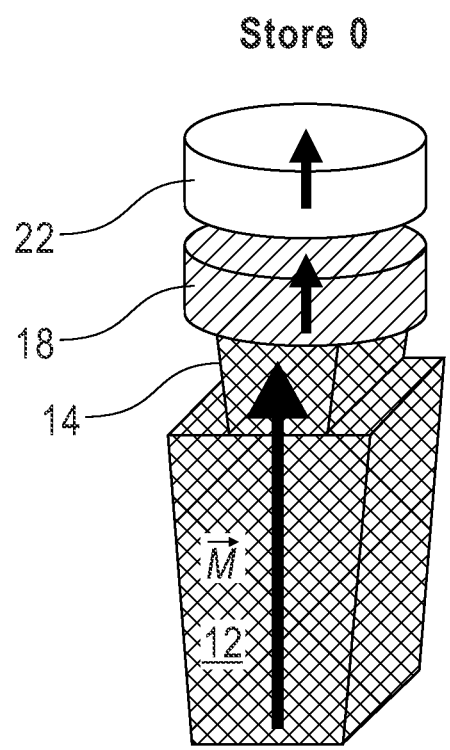
FIG. 4A is a three-dimensional representation of a portion of the MRAM device shown in FIGS. 1A-1B wherein the MRAM device has zero (0) as an output.
Figure 4B:
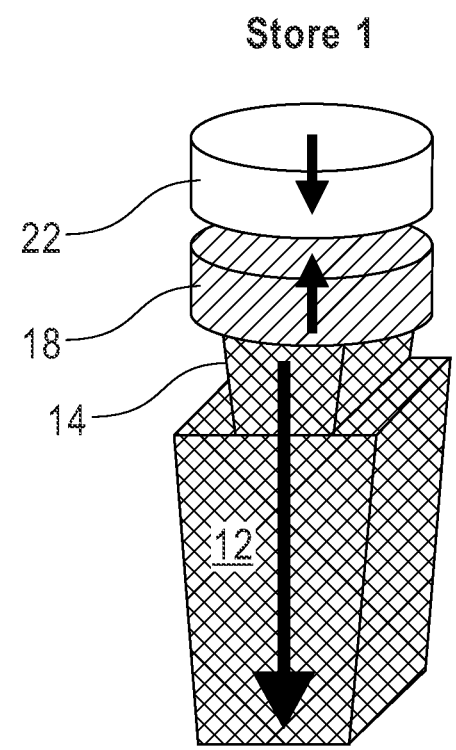
FIG. 4B is a three-dimensional representation of a portion of the MRAM device shown in FIGS. 1A-1B wherein the MRAM device has one (1) as an output.

Notably, and in FIG. 4A, the magnetic via structure 12, the magnetic reference layer 18, and the magnetic free layer 22 all have a magnetization that is pointing upward. Such a MRAM device has zero (0) as an output. In FIG. 4B, the magnetic via structure 12 and the magnetic free layer 22 both have a magnetization that is pointing downward, while the magnetization of the magnetic reference layer 18 points upward. Such a MRAM device has zero (0) as an output.

In FIG. 5A, the magnetic via structure 12, the magnetic reference layer 18, and the magnetic free layer 22 all have a magnetization that is pointing upward. Such a MRAM device has zero (0) as an output. In FIG. 5B, the magnetic via structure 12 and the magnetic free layer 22 both have a magnetization that is pointing downward, while the magnetization of the magnetic reference layer 18 points upward. Such a MRAM device has zero (0) as an output.

Figure 6A:
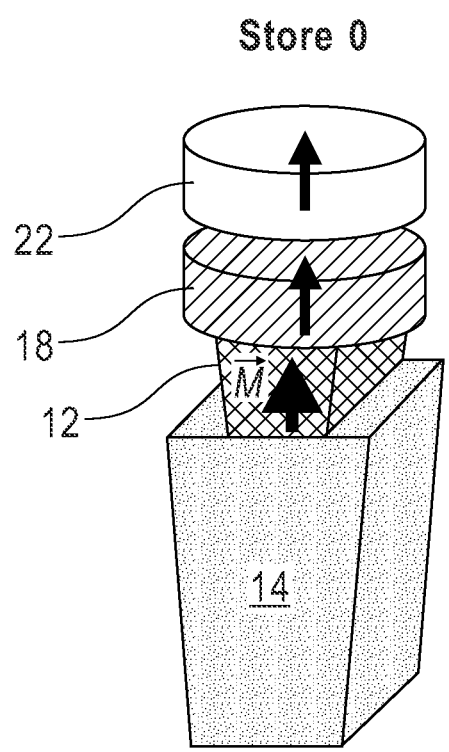
FIG. 6A is a three-dimensional representation of a portion of the MRAM device shown in FIG. 3 wherein the MRAM device has zero (0) as an output.
Figure 6B:
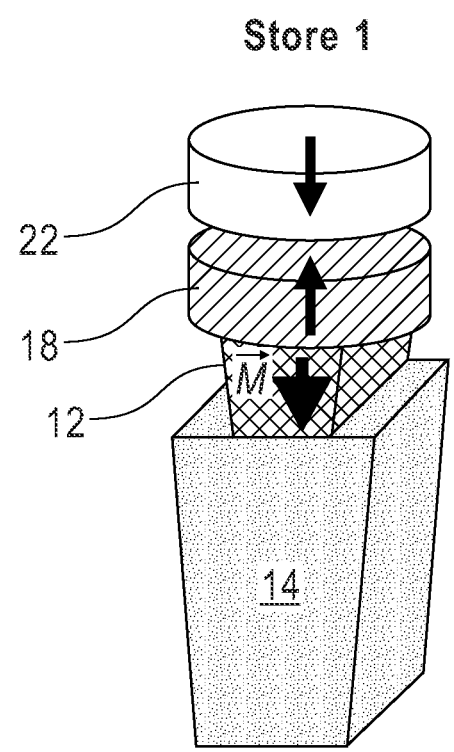
FIG. 6B is a three-dimensional representation of a portion of the MRAM device shown in FIG. 3 wherein the MRAM device has one (1) as an output.

In FIG. 6A, the magnetic via structure 12, the magnetic reference layer 18, and the magnetic free layer 22 all have a magnetization that is pointing upward. Such a MRAM device has zero (0) as an output. In FIG. 6B, the magnetic via structure 12 and the magnetic free layer 22 both have a magnetization that is pointing downward, while the magnetization of the magnetic reference layer 18 points upward. Such a MRAM device has zero (0) as an output.

Figure 7A:
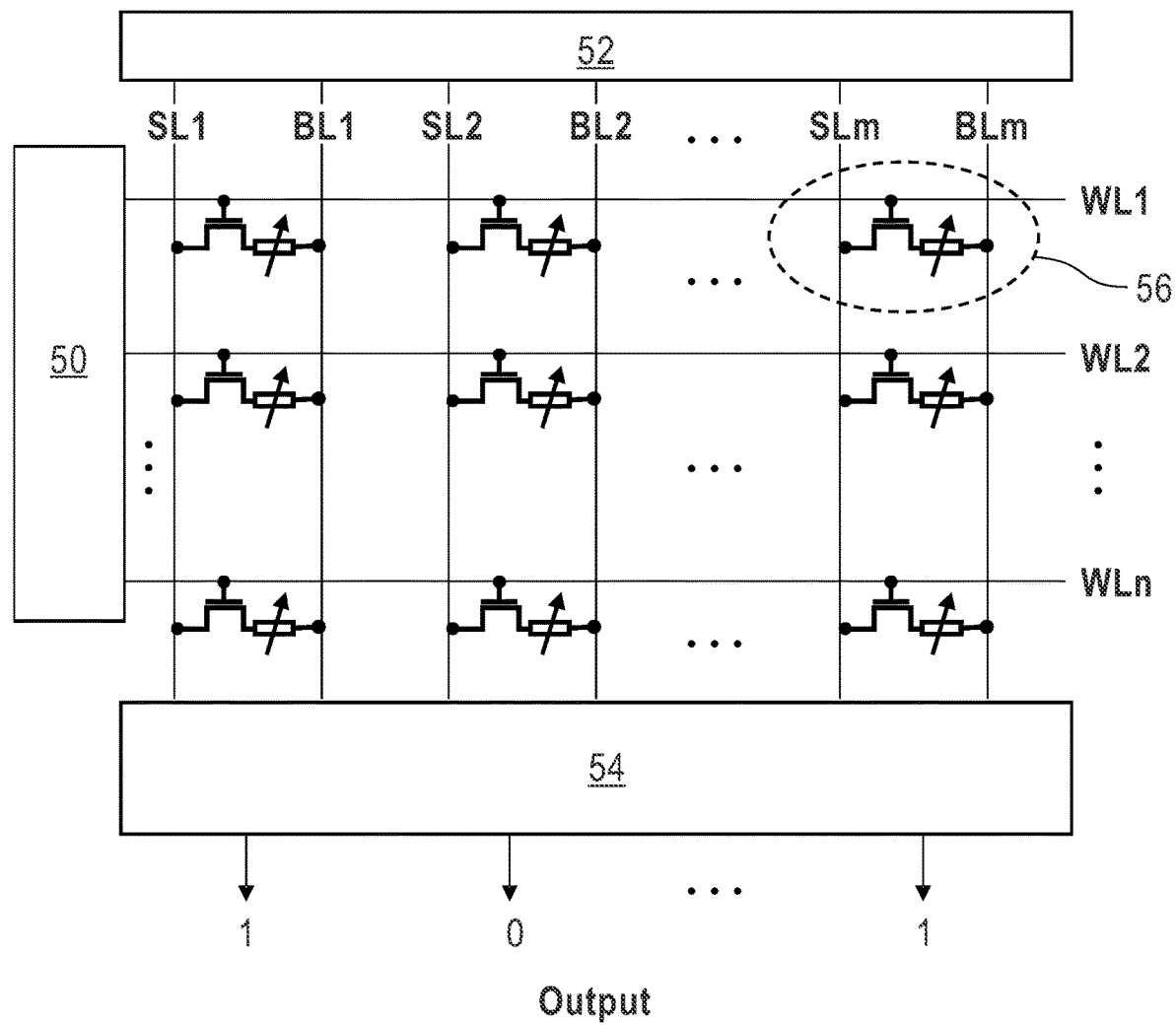
FIG. 7A shows an array of MTJ-containing MRAM devices magnetically coupled to magnetic via structures, wherein the magnetization of each magnetic free layer present in the MTJ structure follows the direction of the magnetic via structure's magnetization.
Figure 7B:
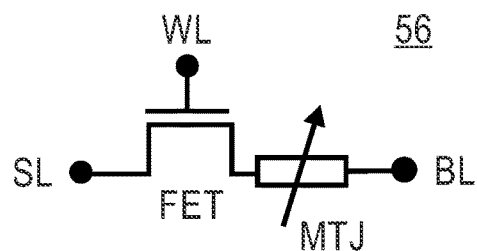
FIG. 7B is a circuit diagram for one of the MTJ-containing MRAM devices contained within the dotted circle shown in FIG. 7A.

Reference is now made to FIG. 7A, which shows an array of MTJ-containing MRAM devices 56 in accordance with an embodiment of the present application. FIG. 7B shows a circuit diagram for one of the MTJ-containing MRAM devices 56 contained within the dotted circle shown in FIG. 7A. The array shown in FIG. 7A includes a plurality of source lines, SL1, SL2 . . . SLm, and a plurality of bitlines, BL1, BL2 . . . BLm, that are spaced apart from each other and both of which are arranged in columns; "m" is an integer greater than 2 for the example shown in FIG. 7A.

A first end of each of the source lines SL1, SL2 . . . SLm, and each of the bitlines, BL1, BL2 . . . BLm, is electrically connected to a column decoder 52, while a second end of each of the source lines SL1, SL2 . . . SLm, and each of the bitlines, BL1, BL2 . . . BLm, is electrically connected to a sense amplifier/analog-to-digital converter 50. An output "0" or "1" can read from the array. The array further includes a plurality of wordlines, WL1, WL2 . . . WLm, arranged in rows. One end of each of the wordlines, WL1, WL2 . . . WLm, is electrically connected to a row decoder 50. The wordlines, bitlines and source lines are electrically conductive structures that are used in conjunction with the MRAM device of the present application to provide an integrated circuit. The array further includes a plurality of MTJ-containing MRAM devices 56. Each MTJ-containing MRAM device 56 includes a switching controller such as a FET and a MRAM device in accordance with the present application, i.e., one including a magnetic via structure, as defined herein, in close proximity to a magnetic free layer of a MTJ structure. In the exemplary embodiment shown in FIG. 7A, a gate of the FET is connected to a wordline, WL, one of the source/drain regions of the FET is connected to a source line, SL, and the other source/drain region of the FET is connected to the MTJ structure, and the MTJ structure is connected to a bitline, BL. In the exemplary embodiment of FIG. 7A, each MTJ-containing MRAM device 56 in the first column (reading from left to right) has a one "1" as an output, each MTJ-containing MRAM device 56 in the second column has a zero "0" as an output, and each MTJ-containing MRAM device 56 in the third column has a one "1".

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

What is claimed is:

1. A magnetoresistive random access memory (MRAM) device comprising:
   a stack of, from bottom to top, a magnetic via structure and a first electrode;
   a first interconnect dielectric material layer embedding both the magnetic via structure and the first electrode;
   a magnetic tunnel junction (MTJ) structure located on the first electrode of the stack, wherein the MTJ structure comprises a tunnel barrier layer sandwiched between a magnetic free layer and a magnetic reference layer; and
   a second electrode located on the MTJ structure, wherein the magnetic free layer of the MTJ structure has a magnetization vector aligned in a same direction as a magnetization vector of the magnetic via structure, the direction of the magnetization vector of the magnetic via structure is random and is dependent on an aspect ratio of the magnetic via structure and a distance between the magnetic via structure and the magnetic free layer, and the magnetic reference layer has a magnetization vector that can be in the same direction as, or a different direction than, the magnetization vector of both the magnetic free layer and the magnetic via structure, and wherein a read out of the magnetization vectors provides chip identification to a chip containing the MRAM device, wherein the aspect ratio of the magnetic via structure is greater than 2:1 and the distance between the magnetic via structure and the magnetic free layer is no more than 30 nm.

2. The MRAM device of claim 1, further comprising a contact structure located on, and contacting a surface of, the second electrode.

3. The MRAM device of claim 2, wherein the contact structure and the MTJ structure are both embedded in a second interconnect dielectric material layer.

4. The MRAM device of claim 1, wherein the MTJ structure is a bottom pinned MTJ structure.

5. The MRAM device of claim 1, wherein the MTJ structure is a top pinned MTJ structure.

6. The MRAM device of claim 1, wherein the magnetic via structure is located directly beneath the first electrode.

7. The MRAM device of claim 1, wherein the magnetic material of the magnetic via structure is compositionally the same as the magnetic material of the first electrode.

8. The MRAM device of claim 1, wherein the magnetic material of the magnetic via structure compositionally differs from the magnetic material of the first electrode.

9. The MRAM device of claim 1, wherein the magnetic via structure is composed of a magnetic material and the first electrode is composed of a non-magnetic, but electrically conductive material.

10. The MRAM device of claim 1, wherein the magnetization vector of the magnetic reference layer is aligned in the same direction as the magnetization vector of both the magnetic via structure and the magnetic free layer, and the read out is 0.

11. The MRAM device of claim 1, wherein the magnetization vector of the magnetic reference layer points in a different direction than the magnetization vector of both the magnetic via structure and the magnetic free layer and the read out is 1.

12. A magnetoresistive random access memory (MRAM) device comprising:
   a stack of, from bottom to top, a first electrode and a magnetic via structure;
   a first interconnect dielectric material layer embedding both the magnetic via structure and the first electrode;
   a magnetic tunnel junction (MTJ) structure located on the magnetic via structure of the stack, wherein the MTJ structure comprises a tunnel barrier layer sandwiched between a magnetic free layer and a magnetic reference layer; and
   a second electrode located on the MTJ structure, wherein the magnetic free layer of the MTJ structure has a magnetization vector aligned in a same direction as a magnetization vector of the magnetic via structure, the direction of the magnetization vector of the magnetic via structure is random and is dependent on an aspect ratio of the magnetic via structure and a distance between the magnetic via structure and the magnetic free layer, and the magnetic reference layer has a magnetization vector that can be in the same direction as, or a different direction than, the magnetization vector of both the magnetic free layer and the magnetic via structure, and wherein a read out of the magnetization vectors provides chip identification to a chip containing the MRAM device, wherein the aspect ratio of the magnetic via structure is greater than 2:1 and the distance between the magnetic via structure and the magnetic free layer is no more than 30 nm.

13. The MRAM device of claim 12, wherein the magnetic via structure is composed of a magnetic material and the first electrode is composed of a non-magnetic, but electrically conductive material.

14. The MRAM device of claim 12, wherein the magnetic via structure and the first electrode are both composed of a magnetic material.

15. A non-volatile memory (NVM) array comprising:
   a plurality of spaced apart magnetoresistive random access memory (MRAM) devices located on a substrate, wherein each MRAM device of the plurality of MRAM devices comprises a magnetic via structure, a first electrode, a first interconnect dielectric material layer embedding both the magnetic via structure and the first electrode, a magnetic tunnel junction (MTJ) structure located above both the first via structure and the first electrode, wherein the MTJ structure comprises a tunnel barrier layer sandwiched between a magnetic free layer and a magnetic reference layer, and a second electrode located on the MTJ structure, wherein the magnetic free layer of the MTJ structure has a magnetization vector aligned in a same direction as a magnetization vector of the magnetic via structure, the direction of the magnetization vector of the magnetic via structure is random and is dependent on an aspect ratio of the magnetic via structure and a distance between the magnetic via structure and the magnetic free layer, and the magnetic reference layer has a magnetization vector that can be in the same direction as, or a different direction than, the magnetization vector of both the magnetic free layer and the magnetic via structure, and wherein a read out of the magnetization vectors provides chip identification to a chip containing the NVM array, wherein the aspect ratio of the magnetic via structure is greater than 2:1 and the distance between the magnetic via structure and the magnetic free layer is no more than 30 nm.

16. The NVM array of claim 15, wherein the magnetic reference layer of a first set of MRAM devices has a magnetization that is the same as the magnetization of both the magnetic via structure and the magnetic free layer in the first set of MRAM devices, and wherein the magnetic reference layer of a second set of MRAM devices has a magnetization that differs from the magnetization of both the magnetic via structure and the magnetic free layer in the second set of MRAM devices.

17. The NVM array of claim 15, wherein the magnetic via structure is located directly beneath the first electrode.

18. The NVM array of claim 15, wherein the magnetic via structure is located directly above the first electrode.

* * * * *